United States Patent [19]  
Chen

[11] 4,160,172  
[45] Jul. 3, 1979

[54] CIRCUIT FOR CONTROLLING DEMANDS OF HIGH CURRENT LOAD

[75] Inventor: Tung C. Chen, Villanova, Pa.

[73] Assignee: Systematics Inc., West Chester, Pa.

[21] Appl. No.: 867,804

[22] Filed: Jan. 9, 1978

[51] Int. Cl.² .................... H03K 17/56; H05B 7/144
[52] U.S. Cl. .................... 307/252 M; 363/124; 219/130.1
[58] Field of Search ............ 307/56, 252 M; 363/64, 363/65, 67, 68, 69, 70, 123, 124, 127, 131; 219/130.51, 131 R

[56] References Cited

U.S. PATENT DOCUMENTS

| | | | |
|---|---|---|---|
| 3,098,949 | 7/1963 | Goldberg | 307/252 M X |
| 3,629,615 | 12/1971 | Gurwicz | 307/252 M |
| 3,999,034 | 12/1976 | Barhast | 219/130.51 X |
| 4,071,885 | 1/1978 | Bilczo | 363/64 |

Primary Examiner—L. T. Hix  
Assistant Examiner—James L. Dwyer  
Attorney, Agent, or Firm—William E. Cleaver

[57] ABSTRACT

The present circuit controls the high current delivered to a load from a direct current (d.c.) power supply through a pair of power silicon controlled rectifiers (SCRS). For each power SCR there is also employed an associated current conduction control SCR. Each of the current conduction control SCRS acts, when triggered, to terminate the current conduction of its associated power SCR. Each current conduction control SCR is controlled by the provision of current thereto during conduction and non-conduction half cycles of an alternating current source, which operates independently of the d.c. power supply. Accordingly, the occurrence of a current (load) transient, even though it may provide an abundance of current to either of said power SCRS, will not prevent the termination of the current conduction of said power SCR for an excessive period after it should have been turned off.

5 Claims, 3 Drawing Figures

CIRCUIT FOR CONTROLLING DEMANDS OF HIGH CURRENT LOAD

BACKGROUND

Very often, in circuit applications, it is necessary to provide high values of current, in the order of hundreds of amperes, to a load. The current demand of a welding machine is a good example. In recent years, it has been the practice, very often, to employ a power silicon controlled rectifier (SCR) as a switch to control such high current demands. The current conduction of an SCR must be terminated by effectively terminating current conduction at the anode or cathode thereof. Such termination is very often accomplished by employing a control SCR which has an accompanying trigger circuit and a power SCR with an accompanying trigger circuit. The trigger circuits are fired after a predetermined R-C time delay and the circuit has a capacitance coupling between the power SCR and the control SCR so that when one SCR is turned on, it turns off the other SCR.

While this technique has been satisfactory to some extent, it has failed to effect termination at times if current transients are created. These current transients can provide a sufficient amount of current to keep an SCR conducting through the termination time period and if the SCR is conducting thereafter, then both SCRS are conducting and there is no means to turn either SCR off. The present circuit is arranged to terminate the operation of each power SCR by having a current conduction control SCR circuit repeatedly render the anode of the power SCR sufficiently negative to effect termination of current conduction. If a power SCR should be maintained in a conducting state by a transient, the current conduction control SCR will get repeated subsequent chances to turn it off and will effect said termination during one of those efforts.

SUMMARY

The present circuit has two power SCRS, each of which has an associated trigger circuit. The trigger circuit of each power SCR has a fixed time delay for firing its associated power SCR, and said triggering circuits are fired alternatively in response to the half cycles of an alternating current power source. In addition, each power SCR has a current conduction control SCR circuit which in turn has its own associated trigger circuit. The trigger circuits of the current conduction control circuits each has a shorter delay time than the trigger circuits of the power SCRS. The current conduction control SCR is repeatedly fired, and when it is fired, it renders the anode, of its associated power SCR, sufficiently negative to turn it off. Since the current conduction control SCRS operate independently of the D.C. power and repeatedly render the anode of their respective power SCRS negative. the power SCRS can be turned off irrespective of any load transients which might be created.

The objects and features of the present invention will be better understood in accordance with the description below, taken in conjunction with the drawings wherein.

Figure 1:
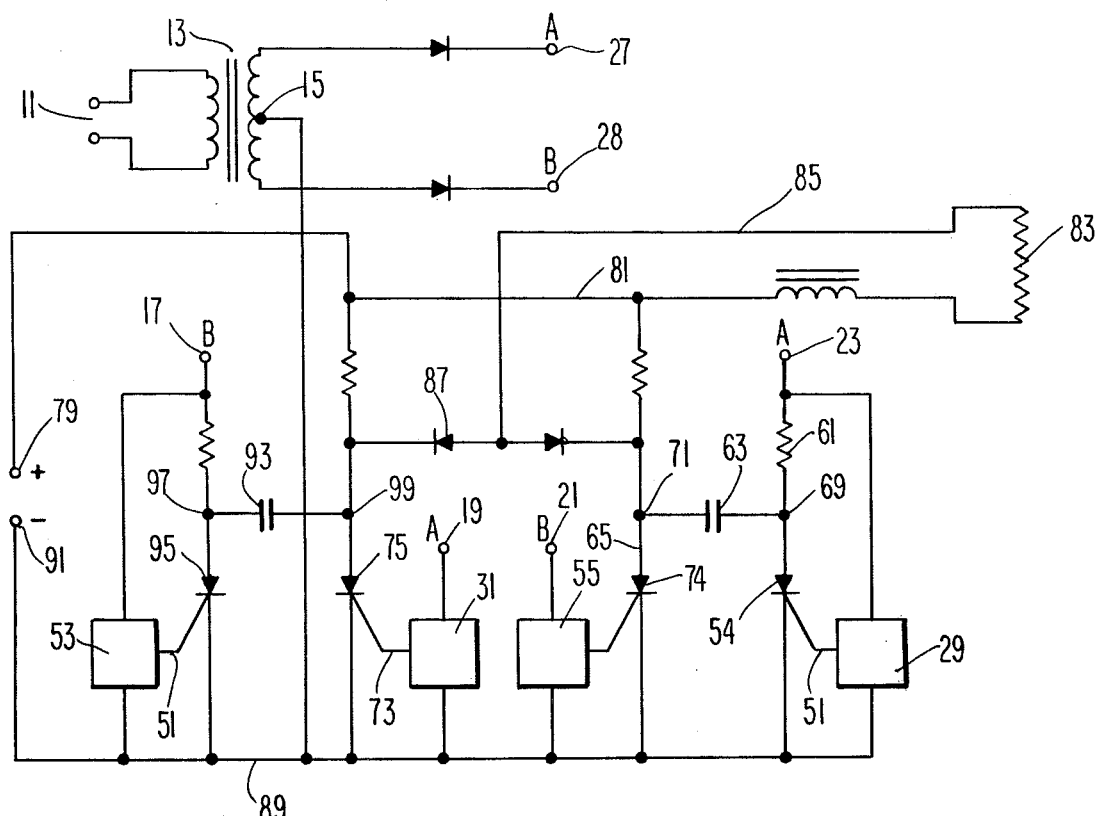
FIG. 1 is a schematic diagram of the present circuit.

Consider FIG. 1 wherein there is shown a power source 11, which is connected to a transformer 13. The secondary of the transformer has a center tap 15 connected to a reference voltage to provide equal voltage values at the upper and lower terminals of the secondary.

The upper and lower terminals are each connected to an associated diode to provide on each terminal a half-wave rectification of the a.c. power supplied to the primary of the transformer 13. The half wave rectified power appears at terminals 27 and 28, and is designated throughout as A power or B power, or as voltage A and voltage B. The half-wave rectified A and B power pulses are applied to the terminals 17, 19, 21 and 23, as shown in the circuit of FIG. 1. The half wave rectified power is depicted graphically in FIG. 2, to provide a basis for showing the firing times in connection therewith.

Figure 3:
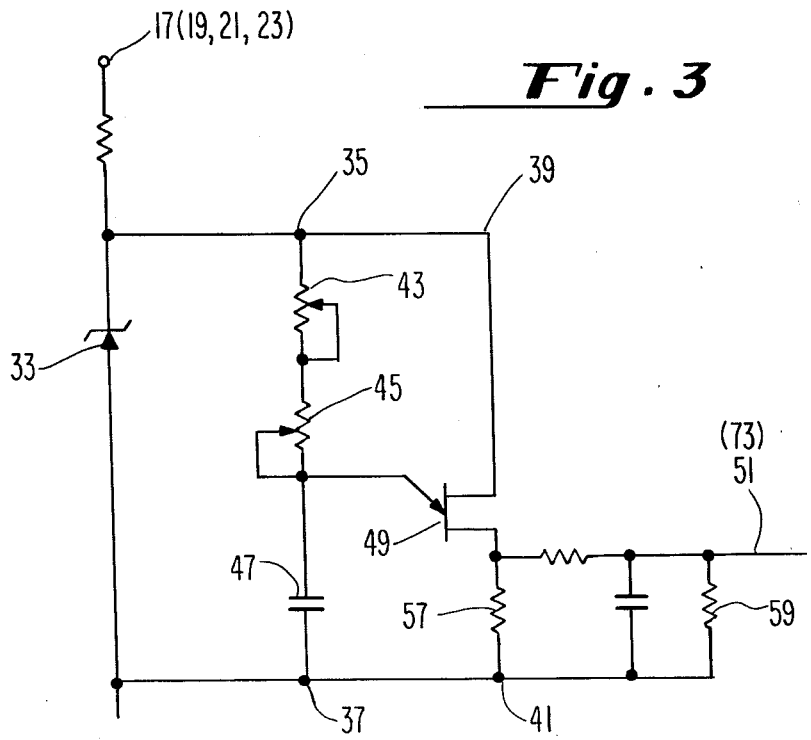
FIG. 3 is a schematic diagram of a typical trigger circuit.

During the A power period or half cycle, when terminal 27 is in a high voltage state, trigger circuits 29 and 31 are eligible to conduct. If we digress and examine FIG. 3, we find a typical trigger circuit used with both triggers 29 and 31 (as well as trigger circuits 53 and 55). In the trigger circuit shown in FIG. 3, when the voltage at terminal 17 goes high, the zener diode 33 conducts to provide a constant voltage across terminals 35 and 37, as well as terminals 39 and 41. The resistors 43 and 45, along with the capacitor 47, provide the RC time constant necessary to provide a delay for firing the unijunction transistor 49. When the voltage across capacitor 47 is about 75% of the voltage across the unijunction transistor terminals, the unijunction transistor 49 will conduct. It should be understood that unijunction transistors, which conduct at some value less than 75%, or more than 75%, could be used, while such an arrangement would change the delay time for providing an output signal from the trigger circuit. The trigger circuit depicted at trigger circuits 29 and 53 has a smaller R-C time factor as related to its unijunction transistor than the trigger circuit used at trigger circuits 31 and 55. Accordingly, the trigger circuits 29 and 53 fire at an earlier time than do the trigger circuits 31 and 55. When the unijunction transistor 49 fires, there is a voltage developed across the resistors 57 and 59, and this provides an output pulse on line 51.

Figure 2:
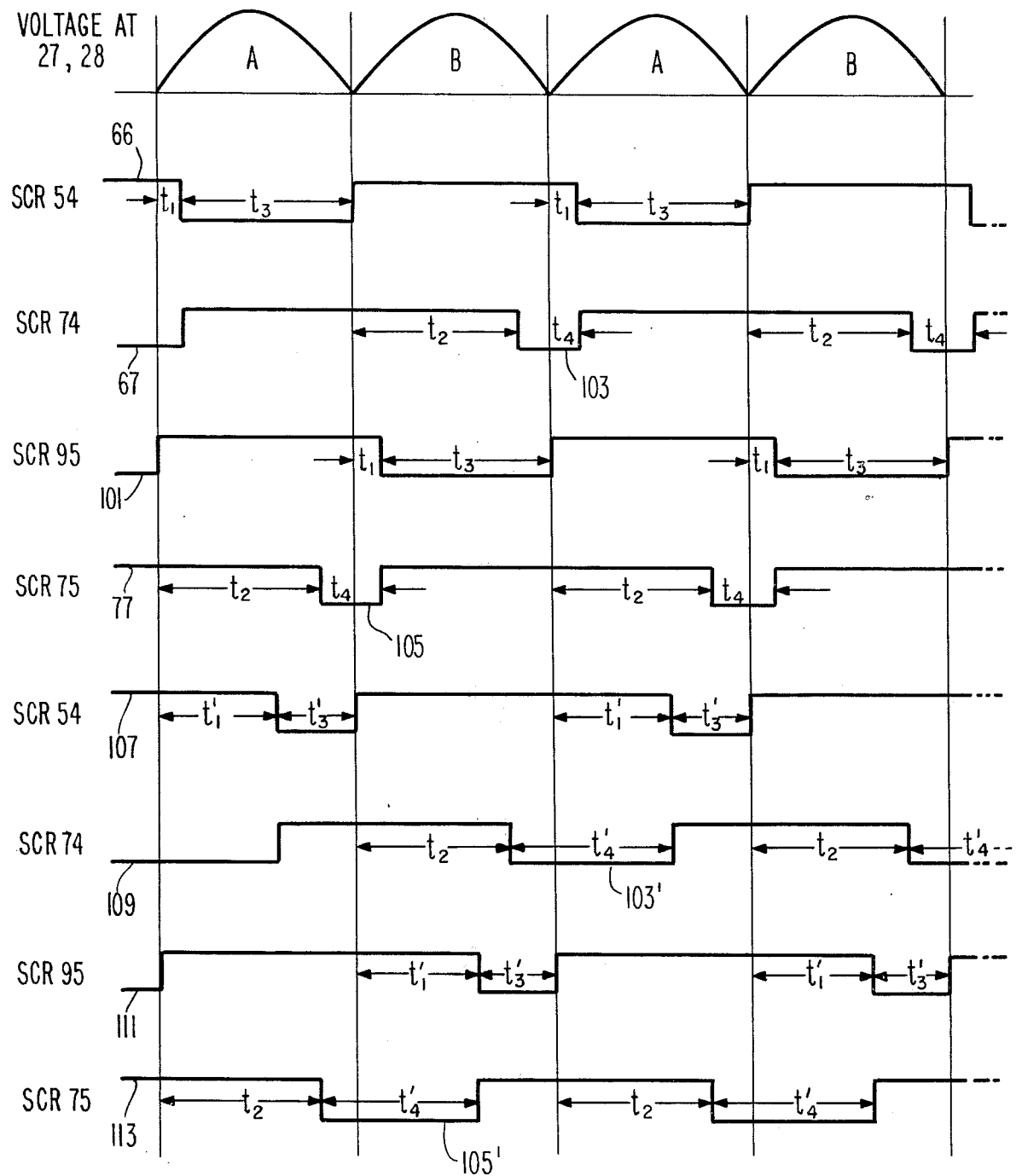
FIG. 2 is a graphic depiction of the firing times of the elements of the circuit as related to half wave periods.

Accordingly, as can be better appreciated by examining FIG. 2, after voltage A has been applied to terminal 23, and after a delay t1, effected by the R-C circuit mentioned above, the trigger circuit 29 conducts, causing SCR 54 to conduct. However, prior to SCR 54 conducting, and during t1 time, as shown in FIG. 2, SCR 74 will be conducting and current will be flowing from the terminal 23, through the resistor 61, to charge the capacitor 63, on through the SCR 74. As will become apparent hereinafter, since the SCR 74 was conducting during B power time, it will continue to conduct during the A power time until the anode 65 is made negative with respect to reference voltage on line 89. It should be understood then that SCR 74 is conducting during t1 time, as is apparent from curve 67 in FIG. 2. When the trigger 29 fires at the end of t1 time, and the SCR 54 conducts as shown by curve 66, FIG. 2, the point 69 approaches zero which causes the point 71 to go negative, in view of the charge developed across the capacitor 63. When the point 71 goes negative, the SCR 74 terminates conduction, and this is depicted on curve 67 of FIG. 2.

Simultaneously, in the sense of happening during the same time period, we find that the A power is applied to the terminal 19, and since the trigger circuit 31 has a larger R-C time factor than the trigger circuit 29, at some later time the trigger circuit 31 also fires, providing an output pulse on line 73, thereby causing the SCR 75 to conduct. This event is depicted in curve 77 of FIG. 2. Accordingly, during the A power time, there is current passing through the load from terminal 79 along line 81, through to load 83, along line 85, through the diode 87, and through the power SCR 75 to the other side of the line 89 and returning to the negative terminal 91. It will be noted that under this arrangement, the power current starts to conduct through the load very close to the end of the A cycle and continues partially into the B cycle (during the t4 period of curve 77).

When the B power is applied to terminal 17, and before the trigger circuit 53 fires, there will be current flow from terminal 17, through the capacitor 93, to charge that capacitor and through the power SCR 75. Accordingly, when the trigger circuit 53 fires to provide a triggering signal on line 51, SCR 95 will conduct causing the point 97 to approach zero and thereby causing the point 99 to go negative due to the charge developed across the capacitor 93. When the point 99 goes negative, power SCR 75 terminates its conduction. If a (load) current transient is created, as very often happens, and the power SCR 75 is provided with sufficient current to its anode, then it will not turn off at the end of t4 time in FIG. 2. However, note that such a current transient cannot be supplied to the anode of SCR 95 and hence it does get turned off at the end of t3 time in FIG. 2. Note also that SCR 95 gets turned on during the next B power period, during t3 time and if there is no excessive current (from a transient) available (the transient having subsided), SCR 75 will be turned off by the negative voltage developed at point 99. SCR 95 gets repeatedly turned on every B power period while SCR 54 gets repeatedly turned on every A power period, independent of the d.c. power and transients. Accordingly, even if a power SCR (such as SCRS 74 and 75) continues to conduct because a transient has provided current to its anode to offset the effort to turn it off, there will be the repeated efforts to turn it off because SCRS 95 and 54 get repeatedly turned on, independent of the d.c. power or any transients.

The firing of SCR 95 is depicted graphically in FIG. 2 by the graph 101. As can be seen from a comparison of the graph 101 with the graph 77, when the SCR 95 conducts during B time, the SCR 75, which is shown by graph 77, will terminate its conduction at the end of the t4 gate.

The circuit continues this operation having the power current pass through SCR 74 during the B time, while passing through the SCR 75 during A time.

If it becomes necessary to provide more load current than the current allowed by the circuit arrangement just described, then the periods of conduction of SCR 75 as depicted in graph 67 by the gate 103, and the period of conduction of SCR 75 as depicted in graph 77 by the gate 105 must be increased. This is effected by changing the delay time of the trigger circuits 29 and 53. The graphs 107, 109, 111 and 113 show a graphic arrangement for a circuit arrangement to provide a larger amount of current to the load. It will be noted that graph 109 represents the firing time of the SCR 74 in the second arrangement, and, as can be seen by comparison with graph 67, SCR 74 in the second arrangement fires much later in the A period than it did under the arrangement shown in graph 67. This, of course, enables the gate 103 to have a longer life than gate 103, and therefore more current is provided through the load. As can be seen by comparison between the graph 77 and 113, the gate 105 is much longer than the gate 105, and this is because of the later firing time of the SCR 95 as shown by the graph 111.

It should be apparent from the foregoing description that irrespective of the transient current that might be created because of the current demand of the load 83, the fact that the SCRS 54 and 95 are independently and repeatedly turned on and off by the rectified a.c. signal there is repeatedly provided a negative voltage at points 71 and 99 to turn off the power SCRS. In this way the power SCRS are controlled even though they are high current demands.

I claim:

1. A circuit for controlling high current conduction providing in combination: alternating current rectifier means adapted to be connected to a source of alternating current power, including first and second output means whereat first and second pulsating half wave voltages are made available, said half wave voltages having a value of zero volts at some time during their respective half wave periods; first and second high current switching means, each having an input element, an output element and a control element; first trigger circuit means coupled to said control element of said first high current switching means and coupled to said first output means to receive first half wave voltage therefrom to turn on said first high current switching means during said first half wave voltage period; second trigger circuit means coupled to said control element of said second high current switching means and coupled to said second output means to receive second half wave voltage therefrom to turn on said second high current switching means during said second half wave voltage period; load means; circuitry means coupling said load means to the respective input elements of said first and second high current switching means, said circuitry means adapted to be connected to a source of direct current voltage whereby when said first and second high current switching means are conducting, current will pass to said load; first and second control switching means, each having an input element, an output element and a control element; said first control switching means connected to said second output means to receive said second half wave voltage therefrom to cause said first control switching means to conduct during said second half wave voltage period and to cease conducting in response to said second half wave voltage decreasing to a value of zero; and first coupling circuitry means coupling said first control switching means to said first high current switching means to turn off said first high current switching means in response to said first control switching means being turned on; and said second control switching means connected to said first output means to receive said first half wave voltage therefrom to cause said second control switching means to conduct during said first half wave voltage period and to cease conducting in response to said first half wave voltage decreasing to a value of zero; and second coupling circuitry means coupling said second control switching means to said second high current switching means to turn off said second high current switching means in response to said second control switching means being turned on.

2. A circuit for controlling high current conduction according to claim 1 wherein said first and second high current switching means are silicon controlled rectifiers.

3. A circuit for controlling high current conduction according to claim 1 wherein each of said first and second trigger circuits includes a unijunction transistor and a resistor-capacitor circuit connected thereto to effect a firing thereof after a predetermined time.

4. A circuit for controlling high current conduction according to claim 1 wherein each of said first and second control switching means includes a silicon controlled rectifier and a trigger circuit.

5. A circuit for controlling high current conduction according to claim 1 wherein each of said first and second coupling circuitry means includes a capacitor connected between a first point of the respective control switching means and a second point of its associated high current switching means so that a change in voltage at said first point effects a change of voltage at said second point to turn off said associated high current switching means.

* * * * *